(12) United States Patent
Dinh et al.

(10) Patent No.: US 8,783,652 B2
(45) Date of Patent: Jul. 22, 2014

(54) LIQUID FLOW CONTROL FOR FILM DEPOSITION

(71) Applicants: Thuc M. Dinh, Shakopee, MN (US); Benjamin Y. H. Liu, North Oaks, MN (US); Yamin Ma, Roseville, MN (US)

(72) Inventors: Thuc M. Dinh, Shakopee, MN (US); Benjamin Y. H. Liu, North Oaks, MN (US); Yamin Ma, Roseville, MN (US)

(73) Assignee: MPS Corporation, Shoreview, MN (US)

( * ) Notice: Subject to any disclaimer, the term of this patent is extended or adjusted under 35 U.S.C. 154(b) by 0 days.

(21) Appl. No.: 13/785,819

(22) Filed: Mar. 5, 2013

(65) Prior Publication Data

US 2013/0233395 A1 Sep. 12, 2013

Related U.S. Application Data

(60) Provisional application No. 61/609,616, filed on Mar. 12, 2012.

(51) Int. Cl.
| *F16K 31/02* | (2006.01) |
| *H01L 21/02* | (2006.01) |
| *F16K 31/122* | (2006.01) |
| *F16K 7/14* | (2006.01) |

(52) U.S. Cl.
CPC ...... *H01L 21/02104* (2013.01); *F16K 31/1221* (2013.01); *F16K 7/14* (2013.01)
USPC ....... 251/129.06; 251/63.6; 251/94; 251/155; 251/331; 137/486

(58) Field of Classification Search
USPC .............. 251/63.6, 89, 94, 129.06, 155, 331; 137/486
See application file for complete search history.

(56) References Cited

U.S. PATENT DOCUMENTS

| 7,055,809 | B2 * | 6/2006 | Sivaramakrishnan et al. ... 261/62 |
| 7,332,040 | B1 * | 2/2008 | Kojima et al. ................. 118/726 |
| 8,191,856 | B2 * | 6/2012 | Matsumoto et al. ..... 251/129.06 |
| 2001/0038083 | A1 * | 11/2001 | Sakurai ..................... 251/129.06 |
| 2006/0060806 | A1 * | 3/2006 | Tanikawa et al. ............ 251/63.6 |
| 2010/0127196 | A1 * | 5/2010 | Sawada et al. ........... 251/129.06 |
| 2010/0224804 | A1 * | 9/2010 | Sneh ........................... 251/30.01 |
| 2010/0224808 | A1 | 9/2010 | Sneh |

FOREIGN PATENT DOCUMENTS

| KR | 1020010030282 A | 4/2001 |
| KR | 1020090088943 A | 8/2009 |
| WO | 2011097238 A2 | 8/2011 |

OTHER PUBLICATIONS

Korean Office Action; Korean Patent Application No. 10-2013-0025646; Office Action issued Feb. 17, 2014.

\* cited by examiner

*Primary Examiner* — John K Fristoe, Jr.
*Assistant Examiner* — Ian Paquette
(74) *Attorney, Agent, or Firm* — Westman, Champlin & Koehler, P.A.; Z. Peter Sawicki; A. Prose

(57) ABSTRACT

An apparatus for controlling liquid flow wherein the apparatus comprises an orifice and an adjacent flexible diaphragm separated from each other by a gap through which a liquid flows. The diaphragm is sufficiently flexible to vary the gap thereby controlling the rate of liquid flowing through the orifice or to provide a positive liquid shutoff of liquid flowing through the orifice. A method for controlling liquid flow through the apparatus comprises flexing said diaphragm to vary a size of the gap to control the rate of liquid flowing through the orifice or to provide a positive liquid shutoff of liquid from flowing through the orifice.

13 Claims, 3 Drawing Sheets

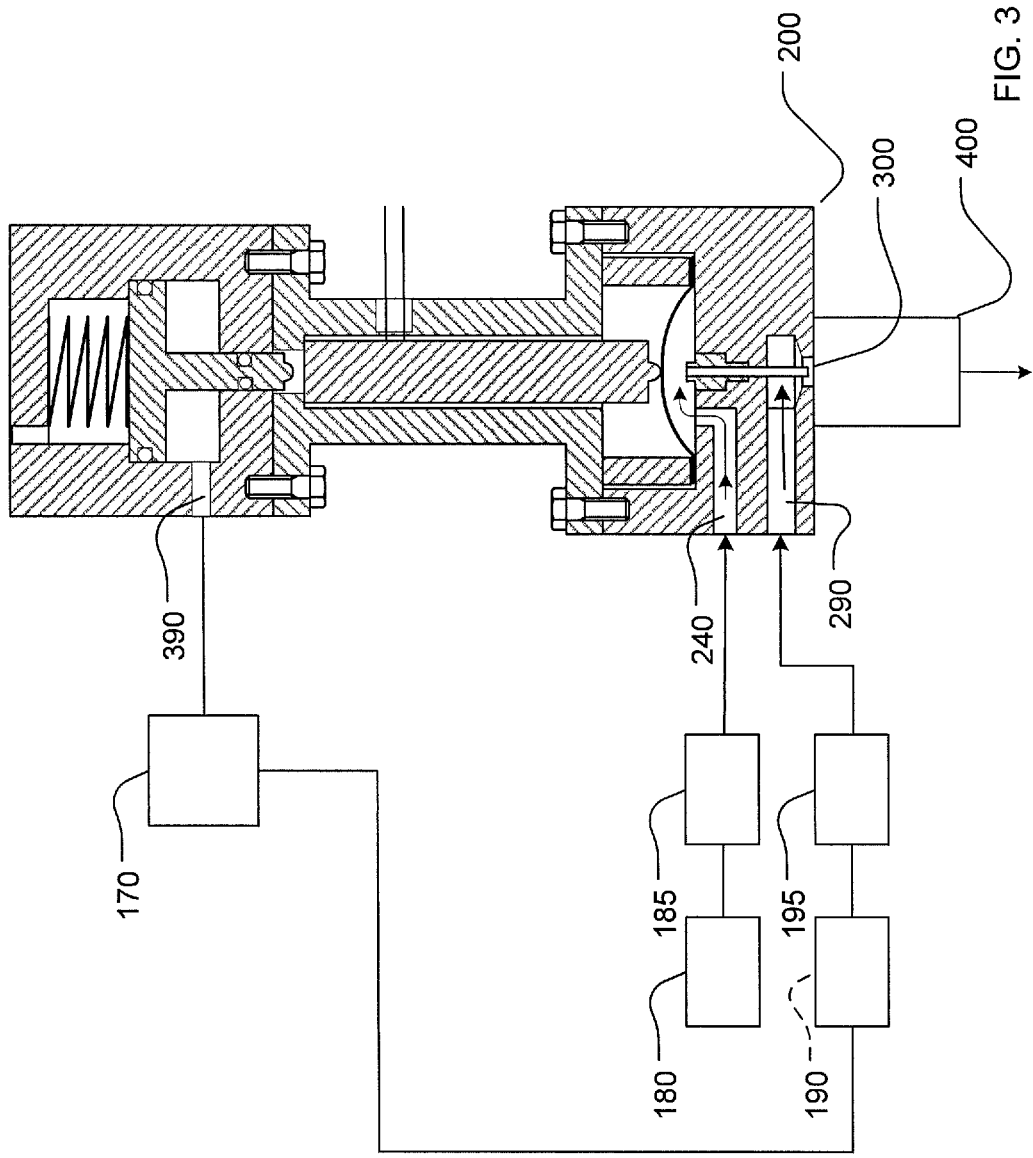

LIQUID FLOW CONTROL FOR FILM DEPOSITION

CROSS REFERENCE TO RELATED APPLICATIONS

The present application is based on and claims the benefit of U.S. provisional patent application Ser. No. 61/609,616, filed Mar. 12, 2012, the content of which is hereby incorporated by reference in its entirety.

BACKGROUND OF THE DISCLOSURE

Thin film deposition for semiconductor device fabrication is generally accomplished through a gas phase process, such as chemical vapor deposition (CVD), plasma enhanced deposition (PECVD) or atomic layer deposition (ALD). The process is typically carried out in a deposition chamber under vacuum conditions with the substrate being exposed to the precursor vapor at an elevated temperature to form thin film. If the precursor chemical is a liquid at room temperature the precursor liquid must first be vaporized to generate vapor to form the desired thin film.

Modern semiconductor device fabrication typically uses a liquid-source vaporization apparatus to generate vapor for thin film deposition. The most widely used vaporizer is the Direct Liquid Injection Vaporizer, which is also referred to as a DLI vaporizer because the liquid is directly injected into the heated vaporizer to generate vapor on demand, i.e. on an as needed basis.

The rate of gas and liquid flow into a DLI vaporizer must be accurately measured and précised controlled. Accurate liquid flow control is usually more difficult than the accurate control of gas flow due to the relatively low rate of liquid flow needed and some liquid properties, such as viscosity and surface tension that can affect the actual rate of liquid delivery into the vaporizer.

The rate of fluid flow can vary greatly from one application to another. In large industrial installations, the liquid flow rate can be in the kilogram per min or higher range. In semiconductor and laboratory research applications, the required liquid flow rate is generally much lower. The flow rate is typically less than 50 g/min and flow rate as low as 0.1 mg/min, i.e. 0.0001 g/min, or even lower may also be encountered. The method and apparatus of the present disclosure are particularly suitable for the control of such low liquid flow rates.

SUMMARY OF THE DISCLOSURE

The present disclosure relates to a method and an apparatus for the precise control of liquid flow in liquid-source vaporization for thin film deposition in semiconductor, integrated circuit device fabrication. The method and apparatus are also useful for film deposition in non-semiconductor applications as well, such as laboratory research and some industrial applications where similar requirements exist for precise liquid flow control as in integrated circuit device manufacturing.

The present disclosure includes an apparatus for controlling liquid flow wherein the apparatus comprises an orifice and an adjacent flexible diaphragm separated from each other by a gap through which a liquid flows. The diaphragm is sufficiently flexible to vary the gap thereby controlling the rate of liquid flowing through the orifice or to provide a positive liquid shutoff of liquid flowing through the orifice.

The disclosure also includes a method for controlling liquid flow through an apparatus comprising an orifice and an adjacent flexible diaphragm separated from each other by a gap through which a liquid flows and flexing said diaphragm to vary a size of the gap to control the rate of liquid flowing through the orifice or to provide a positive liquid shutoff of liquid from flowing through the orifice.

BRIEF DESCRIPTION OF THE DRAWINGS

FIG. 3 is a schematic diagram of a vapor generating system making use of the liquid flow control and shutoff apparatus of the present disclosure

DESCRIPTION OF THE EXEMPLARY EMBODIMENTS

Figure 1:
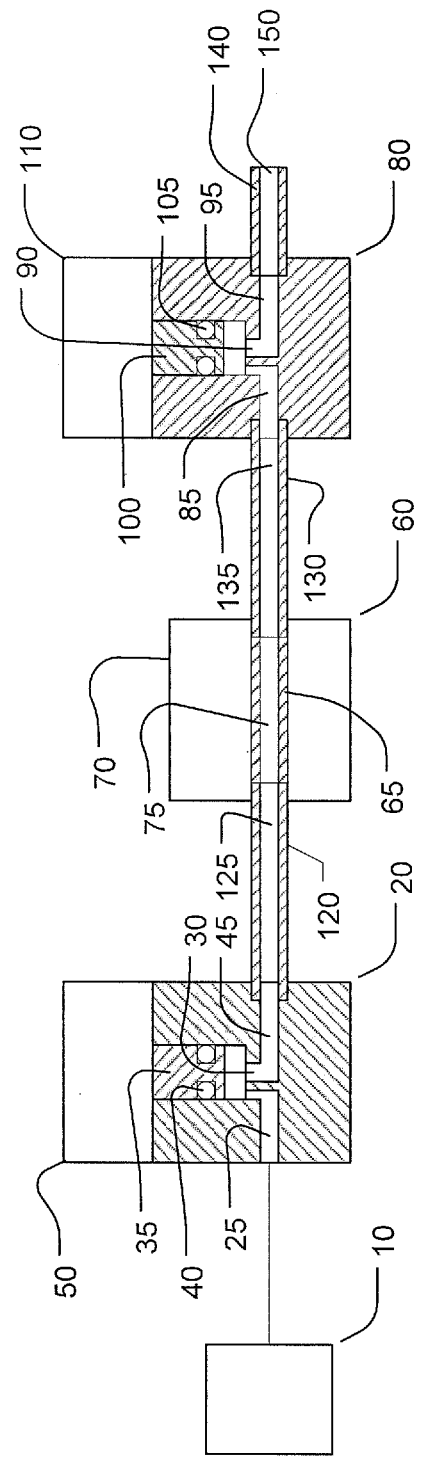
FIG. 1 is a schematic diagram of a conventional system for liquid flow control and shutoff
Figure 2:
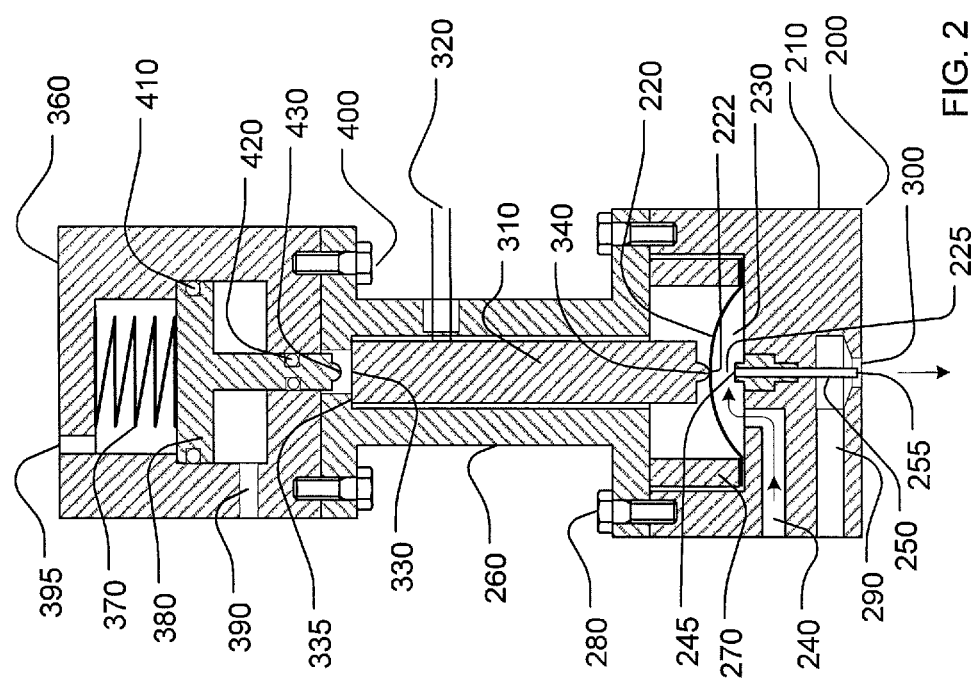
FIG. 2 is a schematic diagram of a liquid flow control and liquid shutoff apparatus of the present disclosure in its preferred embodiment

FIG. 1 is a schematic diagram of a conventional system for liquid flow control in semiconductor applications. FIG. 2 is a schematic diagram of a liquid flow control and liquid shutoff apparatus of the present disclosure in its preferred embodiment. Like reference characters will be used for like elements throughout the figures.

In the conventional system shown in FIG. 1, a source of liquid, 10, under pressure is connected to a liquid shutoff valve, shown generally located at 20. Downstream of the liquid shutoff valve is a liquid flow sensor, shown generally at 60 and a liquid flow control valve, shown generally at 80. All parts of the system are connected by small-diameter tubing as shown in FIG. 1. The connecting tubing is typically made of stainless steel.

Shutoff valve 20 generally includes an inlet flow passageway, 25, for liquid from source 10 to flow into the valve, a flow control orifice, 30, a movable solid member, 35, with an O-ring seal 40 for liquid shutoff, and an outlet flow passageway, 45, for the liquid to flow out of shutoff valve 20. When valve 20 is in its open position, as shown in FIG. 1, the pressurized liquid in source 10 will flow into passageway 25, then through orifice 30, into flow passageway 45, and then out of shutoff valve 20. The solid movable member, 35, can be moved by an actuating mechanism 50 in a direction towards the orifice 30 to close the valve and away from the orifice to open the valve. The valve can thus be turned on and off to allow liquid from source 10 to flow through the valve on an as needed basis.

The actuating mechanism, 50, usually includes an internal spring, which is not shown. When the electrical power is turned off to actuating mechanism 50, the internal spring will exert a force to press the movable solid member 35 firmly against the orifice 30 to close the valve. Such a valve is usually referred as a normally closed valve.

To produce the required motion to open the valve, the actuation mechanism, 50, may include an electrical solenoid to create an electrical force to overcome the force of the spring and move movable solid member 35 away from its normally closed position to the open position shown in FIG. 1. Alternatively a pneumatic piston operated by compressed gas pressure can be used to create the force needed to counter the force of the spring and move the valve to its open position. An electrically operated pilot mechanism can be used in conjunction with the piston to turn the compressed gas on or off electrically to move the piston in the desired direction in order for the valve to open or close.

Flow sensor 60 usually includes a sensor tube 65 inside housing 70. The actual flow sensing mechanism and the associated electronic circuitry are usually placed in the same housing in order to generate an electrical signal output in response to the rate of liquid flowing through sensor 60. The most widely used sensing mechanism is that of the thermal type which senses the rate of liquid flow in a heated sensor tube by the thermal effect created by the flowing liquid stream. This response is detected electronically by means of the sensing mechanism and the electronic circuitry. Another widely used liquid flow sensor is a Coriolis force sensor which produces an electrical output signal in response to the mechanical effect created by the Coriolis force resulting from a flowing liquid passing through a vibrating sensor tube. The operating principles of these liquid flow sensing techniques are well known to those skilled in the art of liquid flow sensor design. It will not be further described in this disclosure.

Flow control valve 80, like liquid shutoff valve 20, also includes an inlet flow passageway, 85, a control orifice, 90, an outlet flow passageway, 95, and a movable solid member 100, which is provided with an O-ring seal 105, and an actuating mechanism, 110 for moving the movable solid member, 100. Unlike the shutoff valve 20 whose actuating mechanism 50 only needs to move movable solid member 35 to a fully open position to open the valve, or to a fully closed position to close the valve, the actuating mechanism 110 of the flow control valve 80 must be capable of moving the movable solid member 100 to a range of intermediate positions between its fully closed to its fully open position. The movement must also be very precise, so that the actuation mechanism can maintain its position in a precise location to control the rate of liquid flow to a specific value. In addition, the movement from one position to another must also be very fast, so that the response speed of the flow control system will also be very fast. As a result, a precise, accurate and fast actuating mechanism 110 must be used to control the movement of the movable solid member 100 in flow control valve, 80. For these reasons, an electrical solenoid or a piezoelectric transducer is often used to produce the required mechanical movement for precise liquid flow control. Both are capable of producing a small, but precise mechanical movement in response to an electrical input signal. In the case of the piezoelectric transducer the movement is produced by the expansion or contraction of solid material having a piezoelectric effect. The solid will expand or contract in response to a DC applied voltage signal. By feedback electronic control the flow sensor output voltage can be compared with a set-point voltage so that the input DC voltage can be adjusted until the sensor output voltage is equal to the set-point value. By this means the liquid flow rate can be controlled and set to a specific value within its operating flow range and maintained at that value over the time period the desired liquid flow rate is to be maintained.

One disadvantage of a control valve operated by a piezoelectric transducer is that the valve is normally open when the electrical power applied to the transducer is turned off. For this reason, an electrically operated control valve is often used in conjunction with a shutoff valve as shown in FIG. 1 in order to prevent the pressurized liquid from flowing through the liquid flow control valve 70 when the latter is placed in its normally open, standby position.

When the liquid shutoff valve 20 of FIG. 1 is placed in its normally closed standby position, all the void space downstream of control orifice 30 in shutoff valve 20 is empty, since orifice 30 is closed by the movable solid member 30. When valve 20 opens, liquid from source 10 will flow through connecting tube 120 into flow sensing tube 75 in flow sensor 60. This flow will then enter into inlet flow passageway 85 in flow control valve 80, then through orifice 90 into downstream flow passageway 95 then out of delivery tube 140. All of these spaces are initially empty and will be filled with liquid during operation. The total volume of these void spaces combined is referred to as the liquid dead volume of the system.

The amount of liquid in the dead volume in the conventional liquid flow control system of FIG. 1 can be quite large in systems that are not well designed. A typical dead volume in a well designed system is on the order of 100 µl. In systems that are not well designed, the dead volume can be much larger. Dead volume in the thousands of microliters range is not uncommon. If the flow control system of FIG. 1 is placed in a standby position for a sufficiently long period of time, the dead volume, which is filled with liquid during operation, can become completely empty, due to liquid leakage from the dead volume through control valve 70, which is open during standby. Upon startup, the initial liquid flow from pressurized source 10 will first flow into this empty dead volume space to fill it, before the liquid can reach the end 150 of delivery tube 140, for the liquid to flow into the vaporizer to generate vapor. If the system has been placed on standby only for a short period of time, only a small amount of liquid will leak through control valve 80. Upon restart, it will take the liquid flow only a short time to fill the empty dead volume. The actual liquid delivered to the vapor generating vaporizer downstream can thus vary greatly depending on the degree to which the dead volume is filled with liquid before the liquid flow is restarted again. This will introduce a degree of variability in the actual rate of liquid delivery into the vaporizer in an otherwise accurate and precise liquid flow control system.

For purpose of illustration, a total dead volume of 100 µl, will take a liquid flow at 100 µl/min to fill the empty dead volume. This means that upon start, the liquid flow of 100 µl/min will not reach outlet 150 of delivery tube 140 until 1 minute later. A delay of 1 minute, or 60 seconds, will be quite detrimental in most applications. This difficulty is normally overcome by installing a diverter valve at the output of the vaporizer that can be operated to direct the vaporizer output gas/vapor mixture to the vacuum pump until a desired diverting period is reached, at which point the diverter valve can be operated to deliver the gas/vapor mixture into the deposition chamber for film deposition. In the illustrative example described above, the diverter valve must be operated for a period of 1.0 minute, before the valve can be directed to deliver the gas/vapor mixture to the film deposition chamber in the deposition tool. The end result is that time and material (liquid) are both wasted in order to overcome the problem created by the dead volume of the liquid delivery system.

The problem is even more critical when the rate of liquid flow is lower or the dead volume is larger or both. Uncontrolled liquid delivery due to the dead volume in the liquid delivery system has often led to operational difficulties, especially in high volume, commercial production of integrated circuit devices.

The problem of the dead volume can be partially overcome by designing the liquid delivery system to minimize the internal dead volume of the system. While the problem can be minimized, it cannot be totally eliminated. The effort needed to overcome the dead volume issue sometimes can be quite substantial in the conventional system shown in FIG. 1.

In addition to the problem of liquid dead volume, the delivery of liquid to the delivery tube 140 at a low rate will cause a drop of liquid to form at end 150 of tube 140 by virtue of the surface tension of the liquid. As more liquid flows out end 150 of tube 140 the liquid drop will remain attached to tube 140 but will become larger. When the accumulated liquid in the drop becomes sufficiently large and the weight of the drop is sufficient large to overcome the effect of surface tension, the drop will detach from tube 140 and begin to fall. An attached drop of liquid at the end of delivery tube 140 will not vaporize. It can vaporize only when the liquid is delivered into the heated environment in the vaporizer located downstream of the vaporizer. As a result the vapor generation rate from such a system will not be steady. Vapor will be generated in the form of periodic bursts when each drop falls away from tube 150 and is delivered to the heated vaporizer.

The size of drop with weight sufficient to overcome the surface tension of the liquid depends will depend on the liquid density, its surface tension as well as the diameter of delivery tube 140. A typical drop size is on the order of 50 µl for a liquid such as water. At the rate of liquid flow of 100 µl/min 50 µl drops will form at the rate of 2 drops per minute, leading to pulses of vapor being generated at the rate of 2 pulses per minute. To overcome the liquid dead volume and unsteady vapor generation in the conventional liquid delivery system of FIG. 1 the apparatus of FIG. 2 can be used.

FIG. 2 illustrates a new, novel system making use of a combined liquid flow control and shutoff apparatus for controlling the rate of liquid flow and liquid shutoff. The apparatus is shown generally located at 200. Unless otherwise stated, all parts of the system are cylindrical in shape with a circular, i.e. round, cross-section. The parts are typically made of stainless steel. The apparatus is comprised of a lower body piece, 210, a flexible solid member in the form of a circular metal diaphragm, 220, held firmly in place by compression piece 270, and middle body piece 260, by means of screws 280. When screws 280 are tightened, compression piece 270 will press tightly against the edge of diaphragm 220 to form a compression seal around the edge of metal diaphragm 220. The lower body piece 210 is provided with an inlet liquid flow passageway 240 allowing a pressurized liquid from an external source, which is not shown, to flow through into space 230 under the diaphragm. The liquid then flows through an outlet flow passageway 250 which also functions as a liquid delivery tube. The liquid flowing out of outlet flow passageway 250 then flows into a downstream vapor generating apparatus, which is also not shown. Flow passageway 250 has an inlet 245 forming an orifice from which liquid in space 230 can enter and an outlet 255 through which the liquid can exit for delivery to an external vapor generating apparatus, which is also not shown.

The middle body piece, 260, is provided with a piezoelectric transducer, 310, that has an upper end, 330, and a lower end, 340. Transducer 310 is held firmly in place between an inside surface 335 in the middle body piece, 260, which serves as an upper stop, while the lower end, 340, is firmly pressed against diaphragm 220. The diaphragm is flexible and acts like a spring to hold the piezoelectric transducer between its two ends. When a DC voltage is applied through a pair of input wires 320, the piezoelectric transducer will expand causing its length to increase. The increased length of the piezoelectric transducer will cause its lower end, 340, which is in contact with diaphragm 220, to move, thus moving diaphragm downward, thereby reducing the width of gap 225 separating the lower surface 222 of diaphragm 220 and orifice inlet 245 of flow passageway 250. Since the pressurized liquid in the external source is kept at a constant pressure, reducing the gap space 225 will cause the rate of liquid flow through inlet orifice 245 to decrease. When a sufficiently high DC voltage is applied to the piezoelectric transducer the diaphragm will move to close the gap, thereby changing the liquid flow rate to a near zero value. By this means, the rate of liquid flow through the apparatus can change from near zero to some upper limit by simply changing the applied DC voltage on the piezoelectric transducer.

The gap space 225 is very small. Typically it is less than approximately 0.1 mm. For clarity the gap space shown in FIG. 1 is greatly enlarged in order to show the design in greater detail. Other parts of the lower body piece 210, such as the length of the flow passageway 250, and its diameter are also greatly enlarged to show the design in greater detail for clarity.

In addition to controlling the rate of liquid flow, apparatus 200 of the present disclosure also includes a liquid shutoff mechanism contained within the upper body piece 360. Upper body piece 360 encloses a spring 370, which presses against a movable pneumatic piston, 380, which is provided with O-ring seals 410 and 420 around its periphery as shown in FIG. 2. As a compressed gas is introduced into the upper body piece 360 through gas inlet 390 from an external compressed gas source, which is not shown, the compressed gas will flow into the upper body piece 360 to exert a force through piston 380 against the force of the spring 370. The piston 380 will thus have its lower end 430 lifted upward and away from the piezoelectric transducer 310 as shown in FIG. 2. There is a small venting hole, 395, in upper body piece 360 so the pressure acting on the upper surface of piston 380 will be substantially the same as the ambient atmosphere pressure. In this position, the upper end 330 of the piezoelectric transducer will be in firm contact with surface 335 of middle body piece 260. At this position, the piezoelectric transducer, 310 can be operated to control the gap space 225 to control the rate of liquid flow through the valve as previously described.

When the compressed gas is turned off, the force of spring 370 will cause the lower end, 420, of piston 380 to move downward to push the piezoelectric transducer 310 down. This in turn causes the lower end 340 of the piezoelectric transducer, which is in contact with diaphragm 220, to push the center of diaphragm 220, which is flexible, to also move down to close gap 225, to shutoff the liquid flow. In this position, the apparatus of FIG. 2 is in its standby shutoff position. The apparatus is designed to have a strong spring 370, so that the strong force of the spring will cause the liquid flow to be completely shutoff. The apparatus of FIG. 2 can thus function as a positive liquid shutoff valve in its normal standby position, or when power is turned off. When power is on during normal operation, the apparatus can function as a flow rate control valve since the lower end 430 of piston 380 is then lifted off of piezoelectric transducer 310 by means of compressed gas pressure.

The combination flow control/flow shutoff apparatus of FIG. 2 will lead to cost savings because of the reduced number of separate components needed for liquid flow control and shutoff. More importantly, the liquid dead volume will be greatly reduced. Liquid dead volume of <10 µl is easily achievable and dead volume as low as 2 µl has been achieved through careful design.

As previously described, liquid flowing out of the end 150 of liquid delivery tube 140 of FIG. 1 will form a drop due to the surface tension of the liquid. As more liquid flows into the drop, which is attached to the end of tube 140 by surface tension, the drop will thus become larger. When enough liquid has accumulated in the drop, the weight of the drop will overcome the force of liquid surface tension, causing the drop to detach from the end of delivery tube 140 to form a free falling drop. The output of such a liquid delivery system will no longer be steady, but in the form of discrete individual drops, falling off of the end of the delivery tube 140 at periodic intervals.

The same phenomena can also occur with the liquid delivery apparatus of the present disclosure. The liquid flow passageway 250 serves as the liquid delivery tube, with outlet 255 at which a liquid drop will also form due to liquid surface tension. To overcome the problem of drop formation due to liquid surface tension, the apparatus of FIG. 2 of the present disclosure also includes an inlet gas flow passageway 290. When a compressed gas source is connected to gas flow passage 290, the gas will flow out of the outlet orifice 300 creating a high velocity gas jet. This high velocity gas jet will create a shear force to cause the liquid accumulating at the end of capillary tube 250 to form a drop to be quickly sheared away as soon as liquid begins to accumulate at the outlet 255. As a result the unsteady liquid flow resulting from liquid surface tension can be largely overcome, though not totally eliminated, by such an apparatus.

The gas velocity needed to detach the liquid drop from end 255 depends on the gas, the liquid's molecular weight and the design of the gas flow system around end 155 of delivery tube 250. In the system shown, tube 250 is centrally located in gas orifice 300 sonic speed is the most effective. In practice a gas velocity as low as 5 to 10% of the speed of sound can be quite effective. For nitrogen with a speed of sound of 334 m/s, a gas velocity of ~20 m/s can be effectively used.

While the apparatus of FIG. 2 is particularly useful for liquid flow control, the same apparatus can also be used for the control of a gas flow in some applications. The apparatus is useful for the control of liquid, especially at a low flow rate. The same design and the feature are also useful for controlling liquid flow at a high rate.

FIG. 3 shows a typical system making use of apparatus of FIG. 2 to control the rate of gas and liquid flow to generate vapor for thin film deposition. The liquid flow control and shutoff apparatus of the present disclosure is shown generally located at 200. Source 180 is a source of liquid under pressure. It is connected to a liquid flow sensor 185, which in turn is connected to the liquid inlet flow passageway 240 in apparatus 200. In addition, there is a compressed gas source 170 connected to the gas inlet passageway 390 to provide compressed gas to operate the pneumatic piston in the apparatus as previously described. Compressed gas source 190 is connected to gas flow controller 190, which is connected in turn to the inlet gas flow passageway 290 to provide the carrier gas needed to operate the apparatus. The gas and liquid flowing out of the outlet 390 then flow into the heated vaporization chamber of the vaporizer 400 as shown in FIG. 3 to generate a gas/vapor mixture for thin film deposition on a substrate.

Although the present disclosure has been described with reference to preferred embodiments, workers skilled in the art will recognize that changes may be made in form and detail without departing from the spirit and scope of the invention.

What is claimed is:

1. An apparatus for controlling liquid flow comprising an orifice and an adjacent flexible diaphragm separated from each other by a gap through which a liquid flows, said diaphragm being sufficiently flexible to vary the gap for controlling the rate of liquid flowing through the orifice or to provide a positive liquid shutoff of liquid flowing through the orifice and a spring to exert a force on said flexible diaphragm for positive liquid flow shut off; wherein a piezoelectric transducer is in contact with said flexible diaphragm and positioned between said diaphragm and a piston, the piston operable by compressed gas to create a force to counter the force of said spring on said flexible diaphragm and place said diaphragm in a position for liquid flow control wherein the spring is capable of exerting a force on the piezoelectric transducer to move the transducer against the flexible diaphragm for positive liquid flow shutoff.

2. The apparatus of claim 1 wherein the piezoelectric transducer provides a force to the flexible diaphragm for controlling the rate of liquid flow.

3. The apparatus of claim 1 including additionally a liquid flow sensor and electronic circuitry to operate said apparatus to permit the liquid to flow through at a selected rate.

4. The apparatus of claim 1 including additionally a pressurized liquid source in a container for delivering liquid to the gap.

5. The apparatus of claim 1 including additionally a flow passageway with an outlet downstream of said orifice to deliver liquid for vaporization and a gas flow passageway directing a gas to flow at a high velocity near said outlet of said flow passageway to reduce the size of liquid drops formed at said outlet.

6. The apparatus of claim 2 said gas flow velocity is higher than 20 meters per second.

7. The apparatus of claim 1, said flexible diaphragm being a metal.

8. The apparatus of claim 4, said diaphragm being stainless steel.

9. A method for controlling liquid flow through an apparatus comprising an orifice and an adjacent flexible diaphragm separated from each other by a gap through which a liquid flows, the orifice comprising a liquid outlet substantially centered within a gas flow passageway outlet, the method comprising:

flexing said diaphragm to vary a size of the gap to control the rate of liquid flowing through the orifice or to provide a positive liquid shutoff of liquid from flowing through the orifice; and providing a gas to flow at high velocity through the gas flow passageway outlet and flowing the gas through the gas outlet in substantially the same direction as the liquid flowing through the liquid outlet to reduce the size of liquid droplets formed at said outlet, wherein said outlet is located downstream of the orifice and in fluid communication therewith.

10. The method of claim 9 wherein the gas flows at a velocity higher than 20 meters per second.

11. The method of claim 9 and further providing an piezoelectric transducer in contact with the flexible diaphragm such that the piezoelectric transducer is operable to flex the diaphragm for controlling the rate of liquid flow.

12. The method of claim 9 and providing a spring to exert a force on the flexible diaphragm for positive liquid flow shutoff.

13. The method of claim 12 and further providing a gas generated force against the spring to counter the force of the spring on the flexible diaphragm thereby placing the diaphragm in a position for liquid flow control.

* * * * *